US012799601B2

(12) United States Patent
Sun

(10) Patent No.: US 12,799,601 B2
(45) Date of Patent: Nov. 17, 2026

(54) SUBSTRATE PROCESSING APPARATUS AND SUBSTRATE PROCESSING METHOD

(71) Applicant: EUGENE TECHNOLOGY CO., LTD., Yongin-si (KR)

(72) Inventor: Hyo Jin Sun, Yongin-si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 0 days.

(21) Appl. No.: 18/927,802

(22) Filed: Oct. 25, 2024

(65) Prior Publication Data

US 2025/0163582 A1 May 22, 2025

(30) Foreign Application Priority Data

Nov. 20, 2023 (KR) ........................ 10-2023-0160108

(51) Int. Cl.
*C23C 16/52* (2006.01)
*C23C 16/46* (2006.01)
(Continued)

(52) U.S. Cl.
CPC .............. *C23C 16/52* (2013.01); *C23C 16/46* (2013.01); *H10P 72/0602* (2026.01); *H10P 74/23* (2026.01)

(58) Field of Classification Search
CPC ... C23C 16/52; C23C 16/46; H01L 21/67248; H01L 22/12; H01L 22/20
See application file for complete search history.

(56) References Cited

U.S. PATENT DOCUMENTS

2010/0124726 A1* 5/2010 Sugishita .......... H01L 21/67248 257/E21.497
2025/0163582 A1* 5/2025 Sun ......................... C23C 16/52
2025/0226246 A1* 7/2025 Yamaguchi ............. H01L 21/31

FOREIGN PATENT DOCUMENTS

CN 1742361 A 3/2006
JP H09199491 A 7/1997
(Continued)

*Primary Examiner* — Jeffrie R Lund
(74) *Attorney, Agent, or Firm* — Renaissance IP Law Group LLP

(57) ABSTRACT

The present disclosure provides a substrate processing apparatus and a substrate processing method, which control an internal temperature of a process tube in a substrate processing process. The substrate processing apparatus includes a process tube configured to provide a process apace in which a processing process for a plurality of substrates laminated in multiple stages is performed, a heater provided outside the process tube to heat the process tube, an internal temperature measuring part provided inside the process tube to measure an internal temperature of the process tube, an external temperature measuring part provided at least partially between the process tube and the heater to measure an external temperature of the process tube, and a controller configured to control an output of the heater by utilizing the internal temperature of the process tube, which is measured in the internal temperature measuring part, and the external temperature of the process tube, which is measured in the external temperature measuring part. The controller includes a preliminary output value operation part configured to operate a preliminary output value of the heater by utilizing the measured internal temperature of the process tube, and a correction determination part configured to determine whether the preliminary output value of the heater is corrected based on the measured external temperature of the process tube.

5 Claims, 3 Drawing Sheets

(51) Int. Cl.
*H10P 72/00* (2026.01)
*H10P 74/00* (2026.01)

(56) References Cited

FOREIGN PATENT DOCUMENTS

| | | | | | |
|---|---|---|---|---|---|
| JP | 2002091574 | A | * | 3/2002 | ......... F27D 21/0014 |
| JP | 2002334844 | A | | 11/2002 | |
| JP | 3380668 | B2 | * | 2/2003 | ......... G05D 23/1931 |
| JP | 4493192 | B2 | * | 6/2010 | .......... H10P 72/0602 |
| JP | 2011044536 | A | | 3/2011 | |
| JP | 5274213 | B2 | * | 8/2013 | ....... H01L 21/67248 |
| JP | 2015170042 | A | * | 9/2015 | |
| KR | 100359734 | B1 | | 11/2002 | |
| KR | 20070088551 | A | | 8/2007 | |
| KR | 20100054732 | A | | 5/2010 | |
| KR | 101302156 | B1 | * | 8/2013 | ....... H01L 21/67248 |
| TW | 554067 | B | * | 9/2003 | ....... H01L 21/67248 |
| TW | 200807203 | A | * | 2/2008 | ......... G05B 23/0254 |
| TW | I437655 | B | * | 5/2014 | ............. G05D 23/22 |
| TW | 202317809 | A | | 5/2023 | |
| TW | I890608 | B | * | 7/2025 | ............ H10P 74/203 |
| TW | I910515 | B | * | 1/2026 | .......... H10P 72/0604 |
| WO | WO-2006070552 | A1 | * | 7/2006 | ......... G05D 23/1931 |

* cited by examiner

SUBSTRATE PROCESSING APPARATUS AND SUBSTRATE PROCESSING METHOD

CROSS-REFERENCE TO RELATED APPLICATION

This application claims priority to Korean Patent Application No. 10-2023-0160108 filed on Nov. 20, 2023 and all the benefits accruing therefrom under 35 U.S.C. § 119, the contents of which are incorporated by reference in their entirety.

BACKGROUND

The present disclosure relates to a substrate processing apparatus and a substrate processing method, and more particularly, to a substrate processing apparatus and a substrate processing apparatus, which control an internal temperature of a process tube in a process of processing a substrate.

A substrate processing apparatus is an apparatus that deposits reactive particles contained in a process gas onto a substrate using a chemical vapor deposition (CVD) method or an atomic layer deposition (ALD) method after disposing the substrate into a process space. The substrate processing apparatus is classified into a single wafer type that may perform a processing process on one substrate and a batch type that may perform a processing process on a plurality of substrates.

In general, a batch-type substrate processing apparatus may perform the processing process by accommodating the plurality of substrates in a vertical process tube in multiple stages, and also, the batch-type substrate processing apparatus may perform the processing process on the plurality of substrates while heating the process tube using an external heater.

Here, the internal temperature (a temperature in the process space) of the process tube in which the substrates are processed affects diffusion, deposition, and other heat treatments. Requirements for a high-quality temperature control may include a high temperature-rising rate (or a high ramp rate) having good temperature uniformity during temperature-rising (or the ramp), rapid temperature stabilization with little (or no) temperature overshoot, a smaller normal-state temperature error band, and a shorter downtime for turning a controller parameter.

In the related art, a single-loop control has been performed using a proportional-integral-derivative (PID) controller, but the required temperature control performance may not be achieved with the single-loop control.

Recently, the proportional-integral-derivative (PID) controller having a cascaded or nested control loop have been used for the improved temperature control, but the conventional approach has a practical limitation related to complexity and computational requirements.

PRIOR ART DOCUMENT

Patent Document

Korean Patent No. 10-0359734

SUMMARY

The present disclosure provides a substrate processing apparatus and a substrate processing method, which effectively control an internal temperature of a process tube by controlling an output of a heater in a substrate processing process.

In accordance with an exemplary embodiment, a substrate processing apparatus includes: a process tube configured to provide a process apace in which a processing process for a plurality of substrates laminated in multiple stages is performed; a heater provided outside the process tube to heat the process tube; an internal temperature measuring part provided inside the process tube to measure an internal temperature of the process tube; an external temperature measuring part provided at least partially between the process tube and the heater to measure an external temperature of the process tube; and a controller configured to control an output of the heater by utilizing the internal temperature of the process tube, which is measured in the internal temperature measuring part, and the external temperature of the process tube, which is measured in the external temperature measuring part, wherein the controller includes: a preliminary output value operation part configured to operate a preliminary output value of the heater by utilizing the measured internal temperature of the process tube; and a correction determination part configured to determine whether the preliminary output value of the heater is corrected based on the measured external temperature of the process tube.

The controller may further include an output value correction part configured to correct the preliminary output value of the heater according to the determination of the correction determination part.

The correction determination part may include: a temperature band setting part configured to set a general control temperature band in which the preliminary output value of the heater is used without a correction and a correction temperature band in which the preliminary output value of the heater is corrected and used; and an external temperature band determination part configured to determine which a temperature band of the general control temperature band and the correction temperature band to which the measured external temperature of the process tube corresponds.

The correction temperature band may include: an attenuation temperature band that is a temperature band greater than the general control temperature band; and a reinforcement temperature band that is a temperature band less than the general control temperature band, wherein the output value correction part is configured to: in the attenuation temperature band, correct the preliminary output value of the heater by multiplying an attenuation coefficient that is inversely proportional to a temperature rise range relative to an upper limit of the general control temperature band by the preliminary output value of the heater, and in the reinforcement temperature band, correct the preliminary output value of the heater by adding a reinforcement value that is proportional to a temperature drop range relative to a lower limit of the general control temperature band to the preliminary output value of the heater.

The heater may be configured to heat the process tube, to be maintained at a standby temperature and then maintain a process temperature during the processing process after raising a temperature of the process tube from the standby temperature to the process temperature, and the general control temperature band and the correction temperature band may have different temperature ranges for each section in a standby temperature section, a temperature-rising section, and a process temperature section.

The preliminary output value operation part may be configured to perform a proportional-integral-differential (PID) operation by utilizing the measured internal temperature of the process tube.

In accordance with another exemplary embodiment, a substrate processing method includes: heating a process tube with a heater provided on the outside of the process tube; measuring an internal temperature of the process tube using an internal temperature measuring part; measuring an external temperature of the process tube using an external temperature measuring part; and controlling an output of the heater by utilizing the measured internal temperature of the process tube and the measured external temperature of the process tube, wherein the controlling of the output of the heater includes: operating a preliminary output value of the heater by utilizing the measured internal temperature of the process tube; and determining whether to correct the preliminary output value of the heater according to the measured external temperature of the process tube.

The controlling the output of the heater may further include correcting the preliminary output value of the heater when it is determined that the preliminary output value of the heater is to be corrected.

The substrate processing method may further include: setting a general control temperature band in which the preliminary output value of the heater is used without a correction; and setting a correction temperature band in which the preliminary output value of the heater is corrected and used, wherein the determining whether to correct the preliminary output value of the heater may include determining which a temperature band of the general control temperature band and the correction temperature band to which the measured external temperature of the process tube corresponds.

The setting the correction temperature band may include: setting an attenuation temperature band that is a temperature band greater than the general control temperature band; and setting a reinforcement temperature band that is a temperature band less than the general control temperature band, wherein the correcting the preliminary output value of the heater may include: correcting the preliminary output value of the heater by multiplying an attenuation coefficient that is inversely proportional to a temperature rise range with respect to an upper limit of the general control temperature band by the preliminary output value of the heater when the measured external temperature of the process tube corresponds to the attenuation temperature band; and correcting the preliminary output value of the heater by adding a reinforcement value that is proportional to a temperature drop range with respect to a lower limit of the general control temperature band to the preliminary output value of the heater when the measured external temperature of the process tube corresponds to the reinforcement temperature band.

The heating of the process tube may include: heating and maintaining the process tube at a standby temperature; raising a temperature of the process tube from the standby temperature to a process temperature; and maintaining the process temperature during a substrate processing process, wherein the general control temperature band and the correction temperature band may have different temperature ranges for each process in the heating and maintaining the process tube, the raising the temperature of the process tube, and the maintaining the process temperature.

The operating of the preliminary output value of the heater may include performing a proportional-integral-differential (PID) operation by utilizing the measured internal temperature of the process tube.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
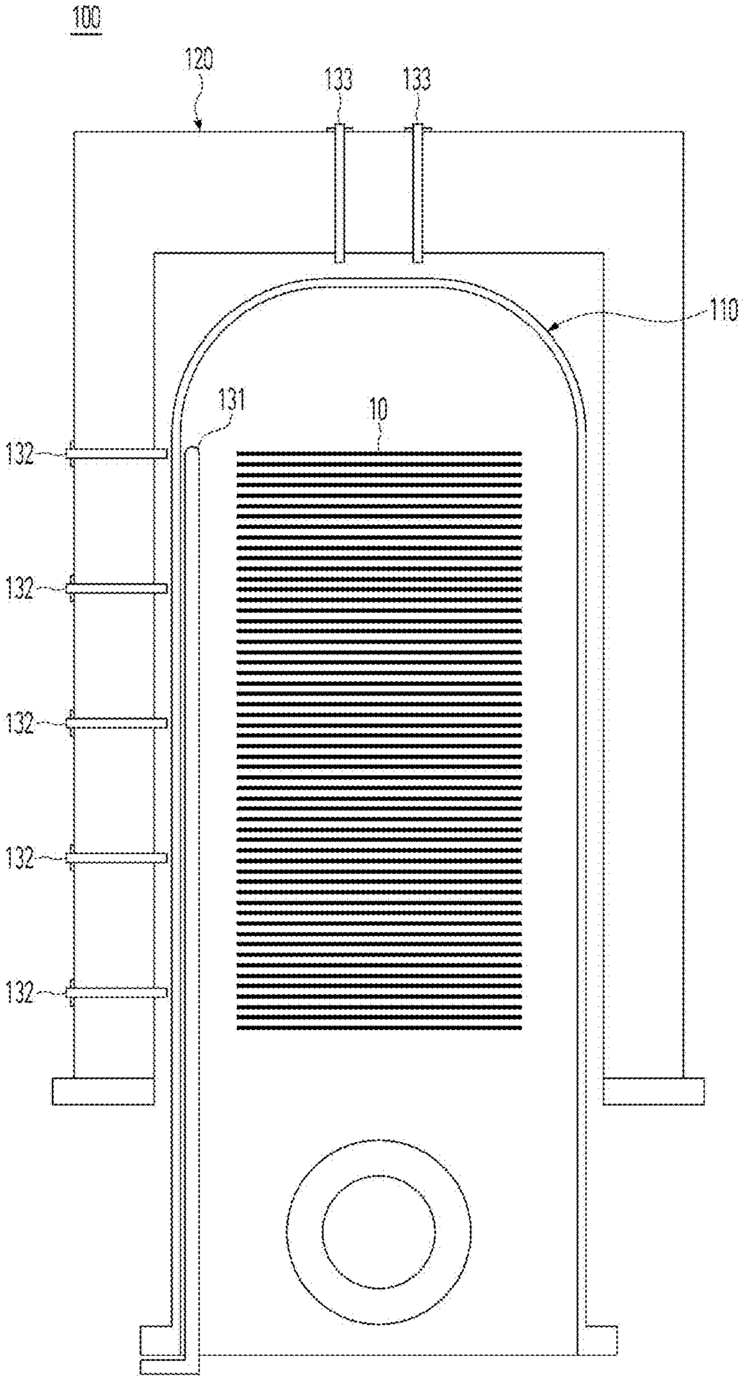
FIG. 1 is a schematic cross-sectional view of a substrate processing apparatus according to an exemplary embodiment.

Hereinafter, specific embodiments will be described in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In the descriptions, the same elements are denoted with the same reference numerals. In the figures, the dimensions of layers and regions are exaggerated for clarity of illustration. Like reference numerals refer to like elements throughout.

FIG. 1 is a schematic cross-sectional view of a substrate processing apparatus according to an exemplary embodiment.

Referring to FIG. 1, a substrate processing apparatus 100 according to an exemplary embodiment may include a process tube 110 providing a process apace in which a processing process for a plurality of substrates 10 laminated in multiple stages is performed, a heater 120 provided outside the process tube 110 to heat the process tube 110, an internal temperature measuring part 131 provided inside the process tube 110 to measure an internal temperature of the process tube 110, an external temperature measuring part 132 provided at least partially between the process tube 110 and the heater 120 to measure an external temperature of the process tube 110, and a controller 140 that controls an output of the heater 120 by utilizing the internal temperature of the process tube 110, which is measured in the internal temperature measuring part 131, and the external temperature of the process tube 110, which is measured in the external temperature measuring part 132.

The process tube 110 may provide the process space in which the processing process is performed on the plurality of substrates 10 laminated in the multiple stages therein and may accommodate the plurality of substrates 10 in the process space to perform the processing process. For example, the process tube 110 may be made of a heat-resistant material such as quartz or ceramic in a cylindrical shape with a closed upper portion and an opened lower portion and may extend in a vertical direction to accommodate a substrate boat in which the plurality of substrates 10 are laminated in a longitudinal direction (or extension direction) of the process tube 110 in the process space, and thus, an actual processing process (e.g., a deposition process) may be performed. Here, the substrate boat may be configured to support the substrate 10 such as a wafer and may be configured so that the plurality of substrates 10 are loaded in the longitudinal direction (i.e., upward and downward direction) of the process tube 110, and a plurality of unit processing spaces in which the plurality of substrates 10 are individually processed may be defined in the substrate boat.

The heater 120 may heat the process tube 110 and may be provided outside the process tube 110 to transmit (or provide) thermal energy to the process tube 110. For example, the heater 120 may include a plurality of heater(s) disposed to surround the process tube 110 at different heights so as to selectively heat each zone of the process space at different heights to heat the process space. In the case of a vertical batch-type substrate processing apparatus 100 that processes the plurality of substrates 10 at the same time, a length of the process tube 110 may reach several meters (m) so that many substrates 10 may be placed. Thus, to precisely control the temperature of the process space inside the process tube 110, the process space may be divided into a plurality of zones and selectively heated using the plurality of heater(s).

The internal temperature measuring part 131 may be provided inside the process tube 110 to measure the internal temperature of the process tube 110 (i.e., the temperature of the process space). For example, the internal temperature measuring part 131 may include a temperature profile thermocouple TC that is disposed to extend along an inner wall of the process tube 110 extending vertically in a rod shape, thereby measuring the internal temperature of the process tube 110 in the zones having different height. The internal temperature measuring part 131 may be supported on a flange that supports the process tube 110 at a lower portion thereof and be connected to the outside through the flange. The thermocouple TC may be bonded to one end of a different type of metal wire to provide a contact point, and since electromotive force is generated when both ends of the thermocouple TC are maintained at different temperatures, the temperature of the contact point may be determined by measuring the electromotive force while maintaining the one end at a constant temperature and the other end at various temperatures.

In addition, the internal temperature measuring part 131 may be inserted vertically into the process space inside the process tube 110, and the thermocouple may be provided in plurality to be provided corresponding to the height of each zone of the processing process, thereby measuring the temperature at the height of the each zone. Here, the output (or heat generation amount) of each of the plurality of heater(s) may be individually controlled by the controller 140 based on the temperature at the height of each zone, which is measured by each of the plurality of thermocouples. Here, the internal temperature measuring part 131 may be disposed as close as possible to the substrate 10, which is an object to be processed.

The external temperature measuring part 132 may be provided at least partially between the process tube 110 and the heater 120 to measure the external temperature of the process tube 110 within the heater 120 (i.e., the temperature of the space between the heater and the process tube). Here, the external temperature measuring part 132 may monitor a heat generation temperature due to a heating element of the heater 120 such as each of the plurality of heater(s) by measuring (or reading) the external temperature of the process tube 110 and may play an important role as a reference temperature at a time when the heater 120 reaches a thermally stable state and also may be utilized as feedback temperature information on a heat transfer state during the temperature rise. For example, the external temperature measuring part 132 may include a bar-shaped spike thermocouple TC. Thus, the external temperature measuring part 132 may be inserted through the outside of the heater 120 so that one end thereof is provided in a space between the process tube 110 and the heater 120 (for example, around the process tube or within a distance of about 5 mm to about 20 mm from the process tube) to measure a temperature of the space between the process tube 110 and the heater 120 (or around the process tube) (i.e., the external temperature of the process tube). The spike thermocouple TC may be provided in plurality and provided to correspond to the height at each zone of the process space.

Here, the internal temperature measuring part 131 and the external temperature measuring part 132 may be separated from each other by the process tube 110 made of the quartz material, and thus, the internal temperature measuring part 131 and the external temperature measuring part 132 may usually not have the same temperature, and their temperatures may also be different in a stable state (or thermal equilibrium state) due to a heat loss and a heat transfer delay by the process tube 110.

The controller 140 may control (or adjust) the output of the heater 120 by utilizing the internal temperature of the process tube 110, which is measured by the internal temperature measuring part 131, and the external temperature of the process tube 110, which is measured by the external temperature measuring part 132, and thus, the measured internal temperature of the process tube 110 may be utilized (or used) to calculate the preliminary output value of the heater 120 to quickly adjust the internal temperature of the process tube 110 to the target temperature (or set temperature), and the measured external temperature of the process tube 110 may be utilized to decide (determine) whether the preliminary output value of the heater 120 is corrected, and/or a correction ratio of the preliminary output value of the heater 120. Depending on whether the preliminary output value of the heater 120 is corrected by using (or utilizing) the external temperature of the measured process tube 110, the preliminary output value of the heater 120 may be used for the output of the heater 120 as it is, or the preliminary output value of the heater 120 may be corrected to be used for the output of the heater 120, thereby controlling the output of the heater 120.

Figure 2:
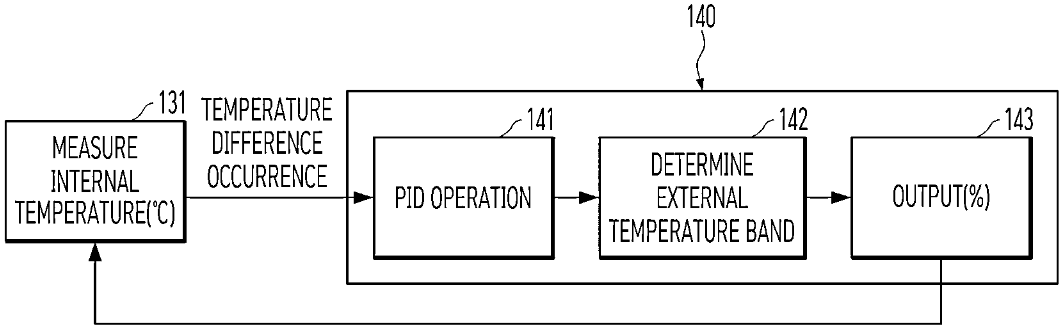
FIG. 2 is a conceptual view for explaining a controller according to an exemplary embodiment.

FIG. 2 is a conceptual view for explaining the controller according to an exemplary embodiment.

Referring to FIG. 2, the controller 140 may include a preliminary output value operation part 141 that operates the preliminary output value of the heater 120 by utilizing the measured internal temperature of the process tube 110, and a correction determination part 142 that determines whether to the preliminary output value of the heater 120 is corrected based on the measured external temperature of the process tube 110. The preliminary output value operation part 141 may operate (or calculate) the preliminary output value of the heater 120 by utilizing the measured internal temperature of the process tube 110 and may calculate the preliminary output value of the heater 120 that may match the internal temperature of the process tube 110 to the target temperature. Only the internal temperature of the measured process tube 110 may be operated to be calculated, and thus, the preliminary output value of the heater 120 may be quickly operated, and the output of the heater 120 may be quickly calculated (or determined) with the single-loop operation. In addition, since the internal temperature of the measured process tube 110 represents the temperature closest to the substrate 10, the output of the heater 120 may be controlled through the preliminary output value of the heater 120 operated (or calculated) using the internal temperature, and thus, an accurate process temperature may be provided to the substrate 10, and a process film quality may be uniform.

Here, the preliminary output value operation part 141 may perform a proportional-integral-derivative (PID) operation using the measured internal temperature of the process tube 110. The preliminary output value operation part 141 may perform the proportional-integral-differentiation (PID) operation so that the measured internal temperature of the process tube 110 matches a target temperature, the controller 140 may perform a proportional-integral-differentiation (PID) control using the preliminary output value of the heater 120 that has undergone the proportional-integral-differentiation (PID) operation, and the output of the heater 120 may be adjusted according to the control of the controller 140.

For example, the preliminary output value operation part 141 may include a differentiation module, an integral operation module, and a proportional operation module. The differentiation module may calculate a differentiation operation for a difference value by using a differentiation constant ($k_d$) value calculated as the difference value between the target temperature and the measured internal temperature of the process tube 110, and a rate of change of the difference value may be determined.

The integral operation module may calculate an integration constant ($k_i$) as the difference value between the target temperature and the measured internal temperature of the process tube 110 to perform addition. Here, the output of the differentiation module may also be used as an input for calculating the integral operation of the integration operation module.

The proportional operation module may calculate a proportional operation using the difference value between the target temperature and the measured internal temperature of the process tube 110 and the proportional constant ($k_p$) calculated from the outputs of the differentiation module and the integration operation module.

The correction determination part 142 may determine whether the preliminary output value of the heater 120 is corrected based on the measured external temperature of the process tube 110 to prevent the output of the heater 120 from exceeding a maximum value and prevent the internal temperature of the process tube 110 from falling below a specific temperature.

Like the related art, if only a temperature inside the process tube 110 is controlled by only the internal temperature of the process tube 110 measured by the internal temperature measuring part 131, positions of the heater 120 and the internal temperature measuring part 131 may be (relatively) apart from each other, and since heat has to move through the internal structure of the process tube 110, a delay in heat transfer may occur, and thus, the difference between the internal temperature of the process tube 110 and the external temperature of the process tube 110 may become large. In particular, when loading the substrate 10 that is not in a steady-state state in which the same temperature is maintained, or when temperature rising and falling are performed, the difference between the internal temperature of the process tube 110 and the external temperature of the process tube 110 may become (even more) severe. In this case, a byproduct film accumulated inside the process tube 110 by the previously performed process may be lifted off to cause particle generation around the substrate 10. In addition to these limitations, the temperature difference between a core of the inside of the heater 120 and the outside of the heater 120 may occur to cause a rapid temperature difference, and materials with different thermal expansion coefficients may be spaced apart from each other to accelerate an secular change rate of components (or accessories) that constitute the substrate processing apparatus 100, thereby ultimately reducing the lifespan.

Thus, the substrate processing apparatus 100 according to the present disclosure may quickly determine (or produce) the output of the heater 120 through the single loop operation by calculating the preliminary output value of the heater 120 by utilizing the measured internal temperature of the process tube 110 and may correct the preliminary output value of the heater 120 when it is determined as the correction by determining whether the preliminary output value of the heater 120 is corrected according to the measured external temperature of the process tube 110 to maintain the difference between the internal temperature and the external temperature of the process tube 110 within a certain level while preventing and/or suppressing the rapid output of the heater 120. Therefore, the output of the heater 120 may be quickly determined, and the lift-up of the byproducts within the process tube 110, which occurs in difference between the internal and external temperatures of the process tube 110 due to the rapid output of the heater 120 and the generation of the particles due to the lift-up may be prevented and/or suppressed.

That is, a guide function through the external temperature of the process tube 110 based on the control utilizing the internal temperature of the process tube 110 measured by the internal temperature measuring part 131 may be implemented simultaneously to prevent an overtemperature and/or an undertemperature of the external temperature of the process tube 110, shorten a parameter setting time of the heater 120 as much as when controlling only with the internal temperature of the process tube 110, and maintain temperature control accuracy as much as in the case of the control of the cascade dual loop. Thus, the substrate processing apparatus 100 according to the present disclosure may have the same effect as the output control of the heater 120 using the cascade dual loop operation even with the single loop operation utilizing the internal temperature of the process tube 110.

In addition, the difference between the internal temperature and the external temperature of the process tube 110 may be maintained at a level in which the secular change rate does not increase, thereby preventing and/or suppressing the lifespan of each component of the substrate processing apparatus 100 from decreasing due to the rapid secular change rate.

In addition, the controller 140 may further include an output value correction part 143 that corrects the preliminary output value of the heater 120 according to the determination of the correction determination part 142. The output value correction part 143 may correct the preliminary output value of the heater 120 based on the determination of the correction determination part 142 and may correct the preliminary output value of the heater 120 only when the correction of the preliminary output value of the heater 120 is determined. As a result, the output value correction part 143 may acquire (or calculate) the (final) output value of the heater 120 and transmit an output signal according to the (final) output value of the heater 120 to the heater 120 to control the output of the heater 120.

Here, the preliminary output value of the heater 120 and the (final) output value of the heater 120 may be expressed as a percentage and be expressed as a ratio between 0 and the maximum output of the heater 120 and thus may be a ratio (%) of the maximum output of the heater 120. For example, if it is 100%, it may be the maximum output of the heater 120, and if it is 0%, the output of the heater 120 may be 0 (or off).

Figure 3:
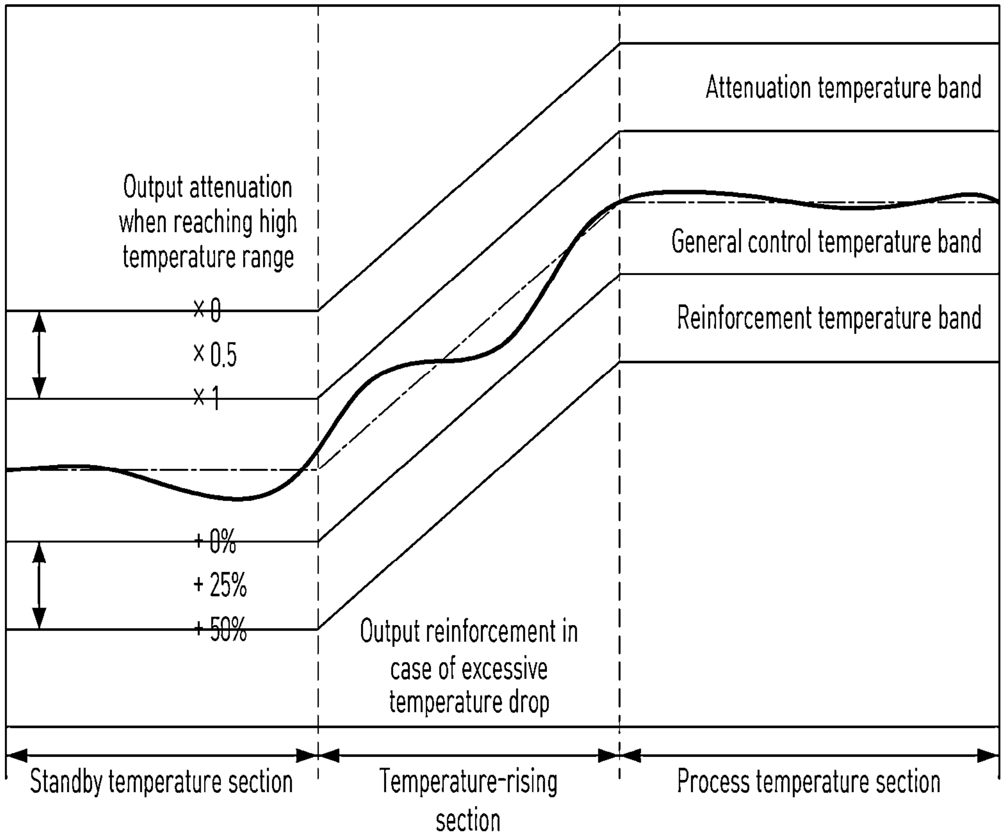
FIG. 3 is a conceptual view for explaining a general control temperature band, an attenuation temperature band, and a reinforcement temperature band according to an exemplary embodiment.

FIG. 3 is a conceptual view for explaining a general control temperature band, an attenuation temperature band, and a reinforcement temperature band according to an exemplary embodiment.

Referring to FIG. 3, the correction determination part 142 may include a temperature band setting part that sets a general control temperature band in which the preliminary output value of the heater is used without a correction and a correction temperature band in which the preliminary output value of the heater is corrected and used, and an external temperature band determination part that determines which a temperature band of the general control temperature band and the correction temperature band to which the measured external temperature of the process tube 110 corresponds. The temperature band setting part may set the general control temperature band in which the preliminary output value of the heater is used without the correction of the preliminary output value of the heater 120 and the correction temperature band in which the preliminary output value of the heater is used by correcting the preliminary output value of the heater 120. Here, in the general control temperature band, the preliminary output value of the heater 120 may be used as the output of the heater 120 without the correction, and in the correction temperature band, the preliminary output value of the heater 120 may be corrected and used (the corrected output value of the heater) as the output of the heater 120.

For example, the general control temperature band may be a temperature band that is neither too high nor too low, may be a temperature band within a predetermined range (or error range) above and below the set temperature, in addition to the set temperature (or the target temperature) for each hour (or for time point), and may be a temperature (range) in a thermally stable state. In addition, the correction temperature band may be a temperature band that is too high or too low, may be a temperature band that is higher or lower than a predetermined temperature range above and below the set temperature, and may be a temperature (range) that is thermally unstable. Thus, in the general control temperature band, even if the preliminary output value of the heater 120 is used as the output of the heater 120 without the correction, the external temperature of the process tube 110 may not be overheated due to the high output, and the internal temperature of the process tube 110 may not fall below a specific temperature.

The external temperature band determination part may determine which a temperature band of the general control temperature band and the correction temperature band which the measured external temperature of the process tube 110 corresponds to, and thus, when the measured external temperature of the process tube 110 corresponds to the general control temperature band, it may be determined as the non-correction of the preliminary output value of the heater 120, and when the measured external temperature of the process tube 110 corresponds to the correction temperature band, it may be determined as the correction of the preliminary output value of the heater 120.

The correction temperature band may include an attenuation temperature band that is a temperature band greater than the general control temperature band and a reinforcement temperature band that is a temperature band less than the general control temperature band. The attenuation temperature band may be a high temperature band higher than the general control temperature band, and when the measured external temperature of the process tube 110 corresponds to the attenuation temperature band, the preliminary output value of the heater 120 may be corrected so that the external temperature of the process tube 110 is not overheated by the high output of the heater 120 and also may be corrected by attenuating to a value less than the preliminary output value of the heater 120.

The reinforcement temperature band may be a low temperature band less than the general control temperature band, and when the measured external temperature of the process tube 110 corresponds to the reinforcement temperature band, the preliminary output value of the heater 120 may be corrected so that the internal temperature of the process tube 110 does not fall below a specific temperature and also may be corrected by being reinforced to be higher than the preliminary output value of the heater 120.

Here, the output value correction part 143 may correct the preliminary output value of the heater by multiplying an attenuation coefficient that is inversely proportional to the temperature rise range relative to an upper limit of the general control temperature band by the preliminary output value of the heater 120 in the attenuation temperature band and may correct the preliminary output value of the heater by adding a reinforcement value that is proportional to a temperature drop range relative to a lower limit of the general control temperature band to the preliminary output value of the heater 120 in the reinforcement temperature band. In the attenuation temperature band, the output value correction part 143 may attenuate and correct the preliminary output value of the heater 120 so that the external temperature of the process tube 110 is not excessively heated due to the high output of the heater 120, and the output value correction part 143 may multiply the preliminary output value of the heater 120 by an attenuation coefficient that is inversely proportional to the temperature rise range for the upper limit of the general control temperature band to correct the preliminary output value of the heater 120 to a lower value. For example, the output value correction part 143 may correct the preliminary output value of the heater 120 so that the (final) output value of the heater 120 gradually decreases as the external temperature of the process tube 110 becomes higher than (the upper limit of) the general control temperature band, and at the lower limit of the attenuation temperature band, which is a boundary with (the upper limit of) the general control temperature band, the preliminary output value of the heater 120 may be multiplied by 1 as the attenuation coefficient, and at the upper limit of the attenuation temperature band, the preliminary output value of the heater 120 may be multiplied by 0 as the attenuation coefficient. That is, as the temperature difference between (the upper limit of) the general control temperature band and the external temperature of the process tube 110 increases between the lower limit and the upper limit of the attenuation temperature band, the attenuation coefficient, which gradually decreases inversely in (a range of) 0 to 1, may be multiplied by the preliminary output value of the heater 120, and at a temperature intermediate between the lower limit and the upper limit of the attenuation temperature band, the preliminary output value of the heater 120 may be multiplied by 0.5 as the attenuation coefficient.

In the reinforcement temperature band, the output value correction part 143 may reinforce and correct the preliminary output value of the heater 120 so that the internal temperature of the process tube 110 does not fall below a specific temperature, and the output value correction part 143 may add a reinforcement value that is proportional to the temperature rise range for the lower limit of the general control temperature band to the preliminary output value of the heater 120 to correct the preliminary output value of the heater 120 to be higher. For example, the output value correction part 143 may correct the preliminary output value of the heater 120 so that the (final) output value of the heater 120 gradually increases as the external temperature of the process tube 110 becomes lower than (the lower limit of) the general control temperature band, and at the upper limit of the reinforcement temperature band, which is a boundary with (the lower limit of) the general control temperature band, about 0% of the preliminary output value of the heater 120 as the reinforcement value may be added to the preliminary output value of the heater 120, and at the lower limit of the reinforcement temperature band, about 50% to about 100% (for example, about 50%) of the preliminary output value of the heater 120 as the reinforcement value may be added to the preliminary output value of the heater 120. That is, as the temperature difference between (the lower limit of) the general control temperature band and the external temperature of the process tube 110 increases between the upper limit and the lower limit of the reinforcement temperature band, the reinforcement value that gradually increases proportionally in (a range of) about 0% to about 50% (~100%) may be added to the preliminary output value of the heater 120, and at an intermediate temperature between the upper limit and the lower limit of the reinforcement temperature band, about 25% (to about 50%) of the preliminary output value of the heater 120 obtained by halving the reinforcement value according to the reinforcement value of about 50% to about 100% of the lower limit of the reinforcement temperature band as the reinforcement value may be added to the preliminary output value of the heater 120.

The temperature band setting part may set (or designate) the upper limit of the attenuation temperature band as a desired temperature at which the external temperature of the process tube 110 is desired to no longer rise, and the output value correction part 143 may allow the (final) output value of the heater 120 to converge to about 0% when the temperature exceeds the upper limit of the attenuation temperature band, thereby lowering the external temperature of the process tube 110 to the attenuation temperature band. For example, the (final) output value of the heater 120 may be about 0% or a predetermined constant (a value close to about 0%).

In addition, the output value correction part 143 may limit the preliminary output value of the heater 120, which is calculated by the proportional-integral-differentiation (PID) within the attenuation temperature range, to enable the (final) output value of the heater 120 to be within a certain guide. In particular, it is possible to select whether a level of the attenuation is linear or exponential within the attenuation temperature band, and when it exceeds the upper limit of the attenuation temperature band, it converges to about 0%, and thus, the external temperature of the process tube 110 may decrease again, and in reality, the output of the heater 120 may be maintained at a constant level. For example, when the level of attenuation is linear, the (final) output value of the heater 120 may be obtained by a linear attenuation equation: the preliminary output value of the heater 120×(1−B/A) (wherein, A is a width of the attenuation temperature band (the upper limit−the lower limit of the attenuation temperature band), and B is a difference value between the measured external temperature of the process tube 110 and the lower limit of the attenuation temperature band (or the upper limit of the general control temperature band), and when the level of attenuation is exponential, the (final) output value of the heater 120 may be obtained by an exponential attenuation equation: the preliminary output value of the heater 120×$e^{-m(1-B/A)}$ (wherein, A and B are the same as the linear attenuation equation, and m is an exponential attenuation gain).

If the attenuation temperature band is too narrow, the output of the heater 120 may be changed rapidly, and thus, the temperature control inside the process tube 110 may become unstable such as frequent on/off of the heater 120. For this reason, it is desirable to set the attenuation temperature band to be mainly about 20 °C to 50 °C (range), and as the control value of the internal temperature of the process tube 110 increases, the attenuation temperature band may also move (or increases) higher (or upward) overall, and thus, a temperature-rising process may be clearly performed.

In the general control temperature band between the attenuation temperature band and the reinforcement temperature band, the preliminary output value of the heater 120 may be used as the (final) output value of the heater 120 as it is, like the control using only the internal temperature of the process tube 110 without any correction by the output value correction part 143. In this case, it may act exactly at the same as when it is controlled only by the internal temperature of the process tube 110. That is, the (final) output value of the heater 120 may be the preliminary output value of the heater 120 and may be the same as the preliminary output value of the heater 120.

In addition, the reinforcement temperature band may correspond to a case in which the external temperature of the process tube 110 drops more than the error range of the set temperature (or the general control temperature band) and may correspond to a case in which the temperature is lowered from a process temperature to a standby temperature after the normal processing is completed. The output value correction part 143 may prevent the external temperature of the process tube 110 from decreasing by reinforcing the output of the heater 120 according to the level at which the external temperature of the process tube 110 decreases when the external temperature of the process tube 110 exists within the reinforcement temperature range. Each of the reinforcement temperature bands may be set independently of the attenuation temperature band and may not be used. For example, the (final) output value of the heater 120 may be obtained by the following equation: the preliminary output value of the heater 120+K*D/C (wherein, C is a width of the reinforcement temperature band (upper limit-lower limit of the reinforcement temperature band), D is a difference between the upper limit of the reinforcement temperature band (or the lower limit of the general control temperature band) and the measured external temperature of the process tube 110, and K is a reinforcement gain).

In the case in which the reinforcement temperature band is used, even if proportional-integral-differential (PID) control is not performed through the reinforcement temperature band, the external temperature of the process tube 110 may be prevented from decreasing, and thus, in the case in which the internal temperature of the process tube 110 is to be maintained above a certain temperature under any circumstances, even in the case of an operational error such as parameter omission by a person (or worker) operating the equipment (i.e., the substrate processing apparatus), the internal temperature of the process tube 110 may be prevented from decreasing below a specific temperature.

In addition, the output value correction part 143 may output the highest (final) output value of the heater 120 to be used in the reinforcement temperature band when the external temperature of the process tube 110 is less than the reinforcement temperature band, thereby reinforcing the external temperature of the process tube 110. Here, to prevent the overheating due to the high output, the highest (final) output value of the heater 120 to be used in the reinforcement temperature band (or the (final) output value of the heater at the lower limit of the reinforcement temperature band) may be set and used. For example, the (final) output value of the heater 120 may be obtained by formula: the preliminary output value of the heater 120+K (where K is the reinforcement gain).

In the case in which the output of the heater 120 is controlled only by the internal temperature of the process tube 110, it may be impossible to prepare for the overtemperature and excessive drop in the external temperature of the process tube 110, and the output of the heater 120 may become (suddenly) high or low due to the (large) difference between the set temperature and the measured internal temperature of the process tube 110 in the attenuation temperature band and the reinforcement temperature band, and the external temperature of the process tube 110 may rise rapidly, and there may be a delay in raising the internal temperature of the process tube 110, and thus, the limitation in which the difference between the external temperature of the process tube 110 and the internal temperature of the process tube 110 increases may occur.

In addition, to prepare for the overtemperature and the excessive drop in the external temperature of the process tube 110, the cascade dual loop control has been used in the related art. However, in the case of the cascade dual loop control, even in the general control temperature band, the operation utilizing the measured external temperature of the process tube 110 may be included in (inside) the control loop, and thus, it may be difficult to be accurately controlled, and it may take a lot of time to determine (or set) the output (parameter) of the appropriate heater 120. In addition, since the cascade dual loop control has to always perform a secondary proportional-integral-differentiation (PID) operation using the external temperature of the process tube 110 on the value calculated after a primary proportional-integral-differentiation (PID) operation using the internal temperature of the process tube 110, the output determination (or calculation) of the heater 120 may be not only complicated, but also require a very long time.

Furthermore, in the cascade dual loop control, if the value calculated in the primary proportional-integral-differentiation (PID) operation may fluctuate greatly, the secondary proportional-integral-differentiation (PID) operation performed in the subsequent order may also fluctuate greatly, and thus, the parameters have be adjusted to select a control that is slow and/or have a small response range, and the range (band) of the temperature, in which the external temperature of the process tube 110 exists has to be determined by setting a variation range for the external temperature of the process tube 110 in advance, and the calculated value obtained thereafter has to be matched again as an output. Therefore, it may take a very long time to find the appropriate (final) output value of the heater 120 in a try-and-error manner, and the values have to be determined based on the experience of a skilled system expert or thermal expert. In addition, even if the (final) output value of the appropriate heater 120 is determined through a complex process as described above, the internal temperature of the process tube 110 may not be measured (or read) due to the characteristics of the dual loop control, and the required amount of heat may not be generated immediately because it is matched only with the external temperature of the process tube 110, and thus, it may be impossible to perform the accurate temperature control as much as controlling the output of the heater 120 only with the internal temperature of the process tube 110 in the general control temperature band.

However, the substrate processing apparatus 100 according to the present disclosure may determine which temperature band of the general control temperature band and the correction temperature band the measured external temperature of the process tube 110 corresponds to the measured external temperature of the process tube 110 through the external temperature band determination part to attenuate and/or reinforce and correct the external temperature, thereby suppressing the maximum and/or minimum variation of the external temperature of the process tube 110 while enabling the accurate temperature control in the general control temperature range and allowing the external temperature of the process tube 110 to exist within a certain guide in the event of the rapid temperature change. As a result, it may be possible to control the internal temperature of the process tube 110 so as to suppress the rapid thermal changes, and to implement the high-difficulty temperature control for processes that are sensitive to the particles inside the process tube 110.

A direct target for raising a temperature by the heater 120 may be a circular dome-shaped process tube 110, and there may be a significant heat transfer delay until the internal temperature of the process tube 110 rises. When the temperature rises from the standby temperature (e.g., about 300 °C to about 500 °C) to the process temperature (e.g., about 550 °C to about 710 °C), a temperature-rising rate per minute may be determined by the operator's empirical decision process, and a temperature-rising rate within about 530 °C/minute to about 30 °C/minute may be usually selected.

Since a time required for the entire process is also determined by the temperature-rising rate, the fastest temperature-rising rate has to be selected, but a continuous film formation process several times has to be possible. This may be mainly expected to operate without stopping for 24 hours in a day, 365 days in a year.

However, if an excessive speed is selected to cause a temperature difference of about 100 °C to 200 °C between the internal temperature and the external temperature of the process tube 110, micro-cracks may occur in a surface of the process tube 110 made of a quartz material due to the repeated temperature operation, or detachment of by-product films remaining on the inside (or inner surface) of the process tube 110 due to the previously performed film formation process may be accelerated. Due to these undesirable effects, it may not only cause an increase of particles on the substrate 10 when a new process is performed, but also shorten the lifespan of the process tube 110 made of the quartz material. This may be particularly problematic when growing insulating films such as silicon oxide films or silicon nitride films.

If analyzing the temperature-rising process in detail, the largest output may be generated immediately after the temperature-rising process (step) of raising from the standby temperature to the process temperature. This is done by applying a large heat supply within a short period of time so that the heater 120, which is maintain a temperature at very low power by reaching the steady state of the standby temperature, raises the internal temperature of the process tube 110 at a desired rate. In this case, a gap between the external temperature of the process tube 110 and the internal temperature of the process tube 110 may become the largest, and in the present disclosure, the temperature control at this vulnerable moment may be softened.

Here, the heater 120 may heat the process tube 110, to maintain the process tube 110 at the standby temperature (or preparation temperature), then raise the temperature of the process tube from the standby temperature to the process temperature, and then maintain the process temperature during the processing process. The general control temperature band and the correction temperature band may have different temperature ranges for each section in a standby temperature section, a temperature-rising section, and a process temperature section. The heater 120 may heat the process tube 110 and also may heat the process tube 110 by dividing the section (or time) into the standby temperature section, the temperature-rising section, and the process temperature section. For example, the heater 120 may maintain the internal temperature of the process tube 110 at the standby temperature and then raise the internal temperature of the process tube 110 from the standby temperature to the process temperature and maintain the process temperature during the processing process and also may raise in internal temperature of the process tube 110 from the standby temperature of about 300 °C to about 500 °C to the process temperature of about 550 °C to about 710 °C and may raise in internal temperature of the process tube 110 at the temperature-rising rate of about 5 °C/minute to about 30 °C/minute.

Here, the general control temperature band and the correction temperature band may have different temperature ranges for each section in the standby temperature section, the temperature-rising section, and the process temperature section, and as the set temperature (or the desired internal temperature of the process tube) may be changed for each section, the general control temperature band (temperature range thereof), which is a temperature band within a predetermined range above and below the set temperature, may be changed, and as the general control temperature band is changed, the correction temperature band (temperature range thereof) outside the general control temperature band may also be changed. As a result, the internal temperature of the process tube 110 may be controlled (or adjusted) smoothly without a large gap between the external temperature of the process tube 110 and the internal temperature of the process tube 110 in all of the standby temperature section, the temperature-rising section, and the process temperature section.

The substrate processing apparatus 100 of the present disclosure may further include an upper temperature measuring part 133 that measures a temperature of an upper end of the process tube 110. The upper temperature measuring part 133 may be provided at least partially between the upper end of the process tube 110 and an upper inner surface of the heater 120 to measure the temperature of the upper end of the process tube 110 and to measure a temperature of a space between the upper inner surface of the heater 120 and the upper end of the process tube 110. Here, the upper temperature measuring part 133 may monitor a heat generation temperature of the upper end of the process tube 110 by measuring (or reading) the temperature of the upper portion of the process tube 110 by the heating element of the heater 120 and may play an important role as a reference temperature at a time when the heater 120 reaches the thermally stable state and may also be utilized as feedback temperature information on the heat transfer state during temperature rise. For example, the upper temperature measuring part 133 may include a rod-shaped spike thermocouple TC, like the external temperature measuring part 132, may be inserted through the outside of the upper end (or upper portion) of the heater 120 so that one end thereof is provided in the space between the upper end of the process tube 110 and the upper inner surface of the heater 120 (for example, within a distance of about 5 mm to about 20 mm from the upper end of the process tube), and may measure the temperature of the space between the upper end of the process tube 110 and the upper inner surface of the heater 120 (i.e., the temperature of the upper end of the process tube).

In addition, the substrate processing apparatus 100 of the present disclosure may further include an overtemperature detection part (not shown) that detects an overtemperature of the process tube 110. The overtemperature detection part (not shown) may be mounted at the same height as the external temperature measuring part 132, and may measure (or read) the temperature at a similar position as the external temperature measuring part 132 and detect the overtemperature of the process tube 110 through a separate circuit from the external temperature measuring part 132 to prevent the process tube 110 from being damaged due to the overtemperature of the process tube 110. For example, the overtemperature detection part (not shown) may use an overtemperature detection sensor, and when the temperature of the overtemperature detection sensor exceeds a threshold temperature (or set temperature), the output (or heat generation amount) of the heater 120 may be reduced or turned off.

Figure 4:
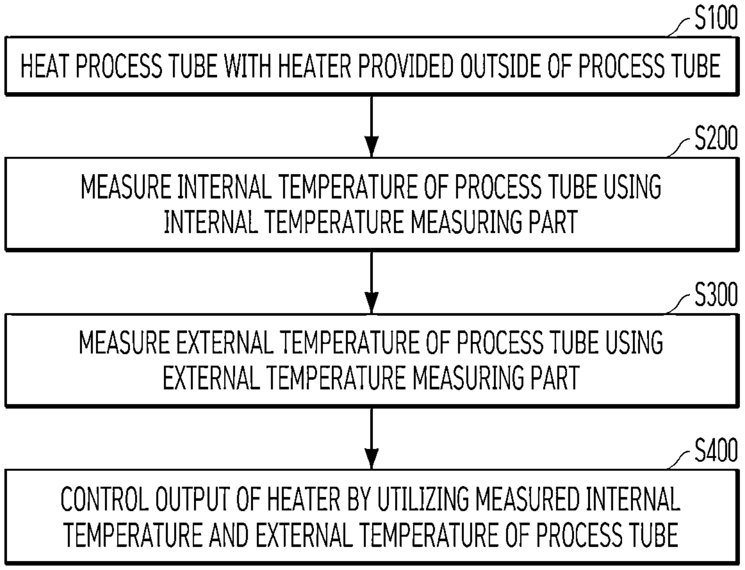
FIG. 4 is a flowchart illustrating a substrate processing method according to another exemplary embodiment.

FIG. 4 is a flowchart illustrating a substrate processing method according to another exemplary embodiment.

Referring to FIG. 4, a substrate processing method according to another embodiment of the present disclosure will be described in more detail. However, details that overlap those described above with respect to the substrate processing apparatus according to an embodiment of the present disclosure will be omitted.

The substrate processing method according to another embodiment of the present disclosure may include a process (S100) of heating a process tube with a heater provided on the outside of the process tube, a process (S200) of measuring an internal temperature of the process tube using an internal temperature measuring part, a process (S300) of measuring an external temperature of the process tube using an external temperature measuring part, and a process (S400) of controlling an output of the heater by utilizing the measured internal temperature of the process tube and the external temperature of the process tube.

First, the process tube is heated by the heater provided at the outside of the process tube (S100). The heater may be provided at the outside of the process tube to heat the process tube and transmit (or provide) thermal energy to the process tube. For example, the heater may include a plurality of heater(s) disposed to surround the process tube at different heights so as to selectively heat zones of a process space within the process tube at different heights to heat the process space.

Next, the internal temperature of the process tube is measured using the internal temperature measuring part (S200). The internal temperature measuring part may be provided inside the process tube to measure the internal temperature of the process tube (i.e., the temperature of the process space). For example, the internal temperature measuring part may include a temperature profile thermocouple TC that is disposed to extend along an inner wall of the process tube extending vertically in a rod shape, thereby measuring the internal temperature of the process tube in the zones having different height. The internal temperature measuring part may be supported on a flange that supports the process tube at a lower portion thereof and be connected to the outside through the flange.

In addition, the external temperature of the process tube is measured using the external temperature measuring part (S300). The external temperature measuring part may be provided at least partially between the process tube 110 and the heater to measure the external temperature of the process tube within the heater (i.e., the temperature of the space between the heater and the process tube). Here, the external temperature measuring part may monitor a heat generation temperature due to a heating element of the heater such as each of the plurality of heater(s) by measuring (or reading) the external temperature of the process tube and may play an important role as a reference temperature at a time when the heater reaches a thermally stable state and also may be utilized as feedback temperature information on a heat transfer state during the temperature rise. For example, the external temperature measuring part may include a bar-shaped spike thermocouple TC. Thus, the external temperature measuring part may be inserted through the outside of the heater so that one end thereof is provided in a space between the process tube and the heater (for example, around the process tube or within a distance of about 5 mm to about 20 mm from the process tube) to measure a temperature of the space between the process tube 110 and the heater (or around the process tube) (i.e., the external temperature of the process tube).

Next, the output of the heater is controlled by utilizing the measured internal temperature of the process tube and the measured external temperature of the process tube (S400). The controller 140 may control (or adjust) the output of the heater by utilizing the internal temperature of the process tube, which is measured by the controller, and the external temperature of the process tube, and thus, the measured internal temperature of the process tube may be utilized (or used) to calculate the preliminary output value of the heater to quickly adjust the internal temperature of the process tube to the target temperature (or set temperature), and the measured external temperature of the process tube may be utilized to decide (determine) whether the preliminary output value of the heater is corrected, and/or a correction ratio of the preliminary output value of the heater. Depending on whether a preliminary output value of the heater using (or utilizing) the measured external temperature of the process tube is corrected, the preliminary output value of the heater may be used as it is for the output of the heater, or the preliminary output value of the heater may be corrected and used for the output of the heater to control the output of the heater.

Here, the process (S400) of controlling the output of the heater may include a process (S410) of operating the preliminary output value of the heater by utilizing the measured internal temperature of the process tube, and a process (S420) of determining whether to correct the preliminary output value of the heater according to the measured external temperature of the process tube.

The preliminary output value of the heater may be operated by utilizing the measured internal temperature of the process tube (S410). The preliminary output value of the heater may be operated (or calculated) by utilizing the internal temperature of the process tube measured through a preliminary output value operation part, and the preliminary output value of the heater may be calculated to match the internal temperature of the process tube to a target temperature. Only the internal temperature of the measured process tube may be operated to be calculated, and thus, the preliminary output value of the heater may be quickly operated, and the output of the heater may be quickly calculated (or determined) with the single-loop operation. In addition, since the internal temperature of the measured process tube represents the temperature closest to a substrate, the output of the heater may be controlled through the preliminary output value of the heater operated (or calculated) using the internal temperature, and thus, an accurate process temperature may be provided to the substrate, and a process film quality may be uniform.

Here, the process (S410) of calculating the preliminary output value of the heater may include a process (S411) of performing a proportional-integral-differentiation (PID) operation by utilizing the measured internal temperature of the process tube.

The measured internal temperature of the process tube may be used to perform the proportional-integral-derivative (PID) operation (S411). The preliminary output value operation part may perform the proportional-integral-differentiation (PID) operation so that the measured internal temperature of the process tube matches a target temperature by utilizing the measured internal temperature of the process tube, and the controller may perform a proportional-integral-differentiation (PID) control using the preliminary output value of the heater that has undergone the proportional-integral-differentiation (PID) operation, and the output of the heater may be adjusted according to the control of the controller.

In addition, whether the preliminary output value of the heater is corrected is determined according to the measured external temperature of the process tube (S420). A correction determination part may determine whether the preliminary output value of the heater is corrected based on the measured external temperature of the process tube to prevent the output of the heater from exceeding a maximum value and prevent the internal temperature of the process tube from falling below a specific temperature.

The process (S400) of controlling the output of the heater may further include a process (S430) of correcting the preliminary output value of the heater when it is determined that the preliminary output value of the heater is to be corrected.

When it is determined that the preliminary output value of the heater needs to be corrected, the preliminary output value of the heater may be corrected (S430). The preliminary output value of the heater may be corrected according to the determination of the correction determination part through the output value correction part, and when the correction of the preliminary output value of the heater is determined, the preliminary output value of the heater may be corrected. As a result, the output value correction part may acquire (or calculate) the (final) output value of the heater and transmit an output signal according to the (final) output value of the heater to the heater to control the output of the heater.

The substrate processing method according to the present disclosure may further include a process (S350) of setting a general control temperature band in which the preliminary output value of the heater is used without a correction and a process (S360) of setting a correction temperature band in which the preliminary output value of the heater is corrected and used.

The general control temperature band in which the preliminary output value of the heater is used without the correction may be set (S350). The general control temperature band in which the preliminary output value of the heater is used without correcting the preliminary output value of the heater may be set through the temperature band setting part. Here, in the general control temperature band, the preliminary output value of the heater may be used as the output of the heater without the correction. For example, the general control temperature band may be a temperature band that is neither too high nor too low, may be a temperature band within a predetermined range (or error range) above and below the set temperature, in addition to the set temperature (or the target temperature) for each hour (or for time point), and may be a temperature (range) in a thermally stable state.

In addition, a correction temperature band in which the preliminary output value of the heater is corrected and used may be set (S360). The temperature band setting part may also set the correction temperature band in which the preliminary output value of the heater is used by correcting the preliminary output value of the heater. Here, in the correction temperature band, the preliminary output value of the heater may be corrected and (the corrected output value of the heater) may be used as the output of the heater. For example, the correction temperature band may be a temperature band that is too high or too low, may be a temperature band that is higher or lower than a predetermined temperature range above and below the set temperature, and may be a temperature (range) that is thermally unstable.

In addition, the process (S420) of determining whether to correct the preliminary output value of the heater may include a process (S421) of determining which temperature band of the general control temperature band and the corrected temperature band to which the measured external temperature of the process tube corresponds.

It is possible to determine which temperature band of the general control temperature band and the correction temperature band to which the measured external temperature of the process tube corresponds (S421). The external temperature band determination part may determine which temperature band of the general control temperature band and the correction temperature band to which the measured external temperature of the process tube corresponds, and thus, when the measured external temperature of the process tube corresponds to the general control temperature band, it may be determined as the non-correction of the preliminary output value of the heater, and when the measured external temperature of the process tube corresponds to the correction temperature band, it may be determined as the correction of the preliminary output value of the heater.

The process (S360) of setting the correction temperature band may include a process (S361) of setting an attenuation temperature band that is a temperature band greater than the general control temperature band and a process (S362) of setting a reinforcement temperature band that is a temperature band less than the general control temperature band.

An attenuation temperature band that is a high temperature band higher than the general control temperature band may be set (S361). The temperature band setting part may set the attenuation temperature band that is the high temperature band greater than the general control temperature band while setting the correction temperature band. Here, the attenuation temperature band may be the high temperature band higher than the general control temperature band, and when the measured external temperature of the process tube corresponds to the attenuation temperature band, the preliminary output value of the heater may be corrected so that the external temperature of the process tube is not overheated by the high output of the heater and also may be corrected by attenuating to a value less than the preliminary output value of the heater.

In addition, the reinforcement temperature band that is a low temperature band less than the general control temperature band may be set (S362). The temperature band setting part may set the reinforcement temperature band that is the temperature band less than the general control temperature band while setting the correction temperature band. Here, the reinforcement temperature band may be the low temperature band less than the general control temperature band, and when the measured external temperature of the process tube corresponds to the reinforcement temperature band, the preliminary output value of the heater may be corrected so that the internal temperature of the process tube does not fall below a specific temperature and also may be corrected by being reinforced to be higher than the preliminary output value of the heater.

Here, the process (S430) of correcting the preliminary output value of the heater may include a process (S431) of correcting the preliminary output value of the heater by multiplying an attenuation coefficient that is inversely proportional to a temperature rise range with respect to an upper limit of the general control temperature band by the preliminary output value of the heater when the measured external temperature of the process tube corresponds to the attenuation temperature band and a process (S432) of correcting the preliminary output value of the heater by adding a reinforcement value that is proportional to a temperature drop range with respect to a lower limit of the general control temperature band to the preliminary output value of the heater when the measured external temperature of the process tube corresponds to the reinforcement temperature band.

If the measured external temperature of the process tube corresponds to the attenuation temperature band, the attenuation coefficient that is inversely proportional to the temperature rise range for the upper limit of the general control temperature band may be multiplied by the preliminary output value of the heater to correct the preliminary output value of the heater (S431). The output value correction part may correct the preliminary output value of the heater by multiplying the preliminary output value of the heater by the attenuation coefficient that is inversely proportional to the temperature rise range with respect to the upper limit of the general control temperature band in the attenuation temperature band. When the measured external temperature of the process tube corresponds to the attenuation temperature band, the output value correction part may attenuate and correct the preliminary output value of the heater so that the external temperature of the process tube is not overheated due to the high output of the heater, and the output value correction part may multiply the preliminary output value of the heater by the attenuation coefficient that is inversely proportional to the temperature rise range with respect to the upper limit of the general control temperature band to correct the preliminary output value of the heater lower. For example, the output value correction part may correct the preliminary output value of the heater so that the (final) output value of the heater gradually decreases as the external temperature of the process tube becomes higher than (the upper limit of) the general control temperature band, and at the lower limit of the attenuation temperature band, which is a boundary with (the upper limit of) the general control temperature band, the preliminary output value of the heater may be multiplied by 1 as the attenuation coefficient, and at the upper limit of the attenuation temperature band, the preliminary output value of the heater may be multiplied by 0 as the attenuation coefficient. That is, as the temperature difference between (the upper limit of) the general control temperature band and the external temperature of the process tube increases between the lower limit and the upper limit of the attenuation temperature band, the attenuation coefficient, which gradually decreases inversely in (a range of) 0 to 1, may be multiplied by the preliminary output value of the heater 120.

In addition, when the measured external temperature of the process tube corresponds to the reinforcement temperature band, a reinforcement value that is proportional to the temperature drop range relative to the lower limit of the general control temperature band may be added to the preliminary output value of the heater to correct the preliminary output value of the heater (S432). The output value correction part may correct the preliminary output value of the heater by adding the reinforcement value that is proportional to the temperature drop range with respect to the lower limit of the general control temperature band in the reinforcement temperature band to the preliminary output value of the heater. When the measured external temperature of the process tube corresponds to the reinforcement temperature band, the output value correction part may reinforce and correct the preliminary output value of the heater so that the internal temperature of the process tube does not fall below a specific temperature, and the output value correction part may add a reinforcement value that is proportional to the temperature rise range with respect to the lower limit of the general control temperature band to the preliminary output value of the heater to correct the preliminary output value of the heater to a higher value. For example, the output value correction part may correct the preliminary output value of the heater so that the (final) output value of the heater gradually increases as the external temperature of the process tube becomes lower than (the lower limit of) the general control temperature band, and at the upper limit of the reinforcement temperature band, which is a boundary with (the lower limit of) the general control temperature band, about 0% of the preliminary output value of the heater as the reinforcement value may be added to the preliminary output value of the heater, and at the lower limit of the reinforcement temperature band, about 50% to about 100% (for example, about 50%) of the preliminary output value of the heater as the reinforcement value may be added to the preliminary output value of the heater. That is, as the temperature difference between (the lower limit of) the general control temperature band and the external temperature of the process tube increases between the upper limit and the lower limit of the reinforcement temperature band, the reinforcement value that gradually increase proportionally in (a range of) about 0% to about 50% (~100%) may be added to the preliminary output value of the heater.

The process (S100) of heating the process tube may include a process (S110) of heating and maintaining the process tube at a standby temperature, a process (S120) of raising a temperature of the process tube from the standby temperature to a process temperature, and a process (S130) of maintaining the process temperature during a substrate processing process.

The process tube may be heated and maintained at the standby temperature (or preparation temperature) (S110). The heater may heat the process tube to maintain the internal temperature of the process tube to the standby temperature.

Then, the temperature of the process tube may rise from the standby temperature to the process temperature (S120). The heater may heat the process tube to raise the internal temperature of the process tube from the standby temperature to the process temperature. For example, the internal temperature of the process tube may rise from the standby temperature of about 300 °C to about 500 °C to the process temperature of about 550 °C to about 710 °C, and the internal temperature of the process tube may rise at a temperature-rising rate within about 5 °C/minute to about 30 °C/minute.

In addition, the process temperature may be maintained during the substrate processing process (S130). The heater may heat the process tube during the substrate processing process to maintain the internal temperature of the process tube at the process temperature.

Here, the general control temperature band and the correction temperature band may have different temperature ranges for each process in the process (S110) of heating and maintaining the process tube, the process (S120) of raising the temperature of the process tube, and the process (S130) of maintaining the process temperature. In the process (S110) of heating and maintaining the process tube, the process (S120) of raising the temperature of the process tube, and the process (S130) of maintaining the process temperature, the temperature range may be different for each process, and as the set temperature (or the desired internal temperature of the process tube) may be changed for each section, the general control temperature band (temperature range thereof), which is a temperature band within a predetermined range above and below the set temperature, may be changed, and as the general control temperature band is changed, the correction temperature band (temperature range thereof) outside the general control temperature band may also be changed. As a result, in all of the process (S110) of heating and the process tube, the process (S120) of raising the temperature of the process tube, and the process (S130) of maintaining the process temperature, a gap between the internal temperature of the process tube and the external temperature of the process tube may not be large, and the internal temperature of the process tube may be smoothly controlled (or adjusted).

When each component of the substrate processing apparatus is made of a material having a different coefficient of thermal expansion, a large difference between the internal and external temperatures of the process tube may accelerates a rate of a secular change of each component and thus consequently reduce the lifespan of each component. However, the substrate processing method according to the present disclosure may prevent the lifespan of each component from being reduced due to the rapid secular change rate by maintaining the difference between the internal and external temperatures of the process tube at a level at which the secular change rate is not accelerated.

As described above, in the present disclosure, the preliminary output value of the heater may be calculated using the measured internal temperature of the process tube to quickly determine the output of the heater with a single loop operation. In addition, when it is determined as correction by determining whether the preliminary output value of the heater is corrected according to the measured external temperature of the process tube, the preliminary output value of the heater may be corrected to maintain the internal temperature and the external temperature of the process tube within the certain level while preventing the sharp change in output of the heater. Therefore, the output of the heater may be quickly determined, and the lift-up of the byproducts within the process tube, which occurs in difference between the internal and external temperatures of the process tube due to the rapid output of the heater and the generation of the particles due to the lift-up may be prevented. That is, even the single loop operation using the internal temperature of the process tube may have the same effect as controlling the output of the heater utilizing the cascade dual loop operation. In addition, in the present disclosure, the difference between the internal and external temperatures of the process tube may be maintained at the level at which the secular change rate does not increases to prevent the decrease in lifespan of each component due to the rapid secular change rate.

The substrate processing apparatus according to the exemplary embodiments, the preliminary output value of the heater may be calculated using the measured internal temperature of the process tube to quickly determine (or calculate) the output of the heater through the single-loop operation. In addition, when it is determined as correction by determining whether the preliminary output value of the heater is corrected according to the measured external temperature of the process tube, the preliminary output value of the heater may be corrected to maintain the internal temperature and the external temperature of the process tube within the certain level while preventing and/or suppressing the sharp change in output of the heater. Therefore, the output of the heater may be quickly determined, and the lift-up of the byproducts within the process tube, which occurs in difference between the internal and external temperatures of the process tube due to the rapid output of the heater and the generation of the particles due to the lift-up may be prevented and/or suppressed. That is, even the single loop operation using the internal temperature of the process tube may have the same effect as controlling the output of the heater utilizing the cascade dual loop operation.

When respective components of the substrate processing apparatus are made of the materials having the different thermal expansion coefficients, the secular change rate of the each component may be accelerated due to the large difference between the internal and external temperatures of the process tube to reduce the lifespan of each component. However, in the substrate processing method according to the present disclosure, the difference between the internal and external temperatures of the process tube may be maintained at the level at which the secular change rate does not increases to prevent and/or suppress the decrease in lifespan of each component due to the rapid secular change rate.

Although embodiments have been described with reference to a number of illustrative embodiments thereof, the embodiments are not limited to the foregoing embodiments, and thus, it should be understood that numerous other modifications and embodiments may be devised by those skilled in the art that will fall within the spirit and scope of the principles of this disclosure. Hence, the real protective scope of the present disclosure shall be determined by the technical scope of the accompanying claims.

What is claimed is:

1. A substrate processing apparatus comprising:

a process tube configured to provide a process space in which a processing process for a plurality of substrates laminated in multiple stages is performed;

a heater provided outside the process tube to heat the process tube;

an internal temperature measuring part provided in the process space inside the process tube to measure a temperature of the process space;

an external temperature measuring part provided at least partially between the process tube and the heater to measure an external temperature of the process tube; and a controller configured to control an output of the heater by utilizing the temperature of the process space, which is measured in the internal temperature measuring part, and the external temperature of the process tube, which is measured in the external temperature measuring part, wherein the controller comprises:

a preliminary output value operation part configured to operate a preliminary output value of the heater by utilizing the measured temperature of the process space; and a correction determination part configured to determine whether the preliminary output value of the heater is corrected based on the measured external temperature of the process tube; and an output value correction part configured to correct the preliminary output value of the heater when a correction of the preliminary output value of the heater is determined according to the determination of the correction determination part based on the measured external temperature of the process tube.

2. A substrate processing apparatus comprising:

a process tube configured to provide a process space in which a processing process for a plurality of substrates laminated in multiple stages is performed;

a heater provided outside the process tube to heat the process tube;

an internal temperature measuring part provided in the process space inside the process tube to measure a temperature of the process space;

an external temperature measuring part provided at least partially between the process tube and the heater to measure an external temperature of the process tube; and a controller configured to control an output of the heater by utilizing the temperature of the process space, which is measured in the internal temperature measuring part, and the external temperature of the process tube, which is measured in the external temperature measuring part, wherein the controller comprises:

a preliminary output value operation part configured to operate a preliminary output value of the heater by utilizing the measured temperature of the process space; and a correction determination part configured to determine whether the preliminary output value of the heater is corrected based on the measured external temperature of the process tube, wherein the correction determination part comprises:

a temperature band setting part configured to set a general control temperature band in which the preliminary output value of the heater is used without a correction and a correction temperature band in which the preliminary output value of the heater is corrected and used; and an external temperature band determination part configured to determine which a temperature band of the general control temperature band and the correction temperature band to which the measured external temperature of the process tube corresponds.

3. The substrate processing apparatus of claim 2, wherein the correction temperature band comprises:

an attenuation temperature band that is a temperature band greater than the general control temperature band; and a reinforcement temperature band that is a temperature band less than the general control temperature band, wherein the output value correction part is configured to:

in the attenuation temperature band, correct the preliminary output value of the heater by multiplying an attenuation coefficient that is inversely proportional to a temperature rise range relative to an upper limit of the general control temperature band by the preliminary output value of the heater, and in the reinforcement temperature band, correct the preliminary output value of the heater by adding a reinforcement value that is proportional to a temperature drop range relative to a lower limit of the general control temperature band to the preliminary output value of the heater.

4. The substrate processing apparatus of claim 2, wherein the heater is configured to heat the process tube, to be maintained at a standby temperature and then maintain a process temperature during the processing process after raising a temperature of the process tube from the standby temperature to the process temperature, and the general control temperature band and the correction temperature band have different temperature ranges for each section in a standby temperature section, a temperature-rising section, and a process temperature section.

5. The substrate processing apparatus of claim 1, wherein the preliminary output value operation part is configured to perform a proportional-integral-differential (PID) operation by utilizing the measured internal temperature of the process space.

* * * * *